United States Patent
Chinnakkonda Vidyapoornachary et al.

(10) Patent No.: US 9,886,200 B2
(45) Date of Patent: *Feb. 6, 2018

(54) CONCURRENT UPGRADE AND BACKUP OF NON-VOLATILE MEMORY

(71) Applicant: International Business Machines Corporation, Armonk, NY (US)

(72) Inventors: Diyanesh B. Chinnakkonda Vidyapoornachary, Bangalore (IN); Kyu-hyoun Kim, Chappaqua, NY (US); Saravanan Sethuraman, Bangalore (IN); Gary A. Tressler, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,230

(22) Filed: Jan. 12, 2017

(65) Prior Publication Data

US 2017/0160936 A1 Jun. 8, 2017

Related U.S. Application Data

(63) Continuation of application No. 14/957,180, filed on Dec. 2, 2015.

(51) Int. Cl.
*G06F 3/06* (2006.01)
*G11C 16/34* (2006.01)

(52) U.S. Cl.
CPC ........... *G06F 3/061* (2013.01); *G06F 3/0655* (2013.01); *G06F 3/0679* (2013.01); *G11C 16/349* (2013.01)

(58) Field of Classification Search
CPC ............ G06F 12/0238; G06F 12/0246; G06F 12/0638; G06F 2212/1032; G06F 2212/205

(Continued)

(56) References Cited

U.S. PATENT DOCUMENTS

| 7,990,797 B2 | 8/2011 | Moshayedi et al. |
| 8,656,072 B2 | 2/2014 | Hinkle et al. |

(Continued)

FOREIGN PATENT DOCUMENTS

WO 2015012858 A1 1/2015

OTHER PUBLICATIONS

Huang, H., "Design Persistent System with NVDIMM," Santa Clara, CA, Aug. 7, 2014, Windawn Technology,14 pgs.
Huang et al., "Design and Implementation of Flash Based NVDIMM," Aug. 20-21, 2014,6 pgs., 978-1-4799-5576-3/14, © 2014 IEEE.

(Continued)

*Primary Examiner* — Gary Portka
(74) *Attorney, Agent, or Firm* — Nicholas D. Bowman

(57) ABSTRACT

An endurance parameter value of a non-volatile memory included in a non-volatile dual in-line memory module (NVDIMM) can be monitored and compared against a warning threshold value. In response to the endurance parameter exceeding the warning threshold value, a system alert can be generated, within a host system of the NVDIMM, to inform a system user that the NVDIMM is approaching its end-of-life. If the endurance parameter exceeds a replacement threshold value greater than the warning threshold value, an upgrade process can be initiated. The upgrade process can include copying data from the first non-volatile memory to a volatile memory of the NVDIMM and copying, in response to the first non-volatile memory being replaced with a second non-volatile memory, the data from the volatile memory to the second non-volatile memory.

1 Claim, 3 Drawing Sheets

(58) Field of Classification Search
USPC ........ 711/101, 103, 104, 115, 161, 162, 165
See application file for complete search history.

(56) References Cited

U.S. PATENT DOCUMENTS

| | | |
|---|---|---|
| 8,756,366 B2 | 6/2014 | Chien et al. |
| 8,874,831 B2 | 10/2014 | Lee et al. |
| 8,949,502 B2 | 2/2015 | McKnight et al. |
| 9,348,705 B1 | 5/2016 | Wu et al. |
| 9,529,543 B1 | 12/2016 | Chinnakkonda Vidyapoornachary et al. |
| 9,535,828 B1 | 1/2017 | McKelvie et al. |
| 2008/0183966 A1 | 7/2008 | Shim et al. |
| 2014/0281661 A1 | 9/2014 | Milton et al. |
| 2014/0304462 A1 | 10/2014 | Venugopal et al. |
| 2015/0149820 A1 | 5/2015 | Song |
| 2016/0071608 A1 | 3/2016 | Bronner et al. |
| 2017/0185123 A1 | 6/2017 | Venugopal et al. |

OTHER PUBLICATIONS

Mellor, C., "Micron glues DDR4 RAM to flash, animates the 256GB franken-DIMM," http://www.theregister.co.uk/2013/02/03/micron_ddr4_hdimm/, Feb. 13, 2013, printed Jun. 23, 2015, 4 pgs.

Unknown, "Micron brings NVDIMMs to Enterprise," http://mandetech.com/2013/02/24/micron-brings-nvdimms-to-enterprise, © 2015 Media & Entertainment Technology, printed Jun. 23, 2015, 5 pgs.

Chinnakkonda Vidyapoornachary et al., "Concurrent Upgrade and Backup of Non-Volatile Memory", U.S. Appl. No. 14/957,180, filed Dec. 2, 2015.

IBM, List of IBM Patents or Patent Applications Treated as Related, Jan. 10, 2017, 2 pages.

U.S. Appl. No. 15/131,152, Accelerated Examination Support Document, Dated Apr. 14, 2016, 10 pages.

Chinnakkonda Vidyapoornachary et al., "Concurrent Upgrade and Backup of Non-Volatile Memory", U.S. Appl. No. 15/404,232, filed Jan. 12, 2017.

U.S. Appl. No. 15/404,232, Accelerated Examination Support Document, Dated Jan. 6, 2017, 11 pages.

CONCURRENT UPGRADE AND BACKUP OF NON-VOLATILE MEMORY

BACKGROUND

The present disclosure generally relates to a hybrid volatile/non-volatile memory device. In particular, this disclosure relates to replacing a non-volatile memory component of such a hybrid memory device.

Semiconductor memory devices or chips can be used in computers and other electronic systems to electronically store data. For example, instructions for a processor circuit and data processed by the processor circuit can both be stored in semiconductor memory chips. Such memory chips may be fabricated using a variety of semiconductor technologies. The time to access all data locations within a semiconductor memory chip is generally uniform, which can result in efficient storage and retrieval of data from any data location within the chip. Semiconductor memory chips can be "volatile" or "non-volatile" with regards to data retention during interruption of electrical power supplied to a chip. A volatile memory chip can lose data when the power supplied to the chip is interrupted, and a non-volatile chip is designed to retain data during power supply interruptions.

SUMMARY

Embodiments may be directed towards a method. The method may include monitoring an endurance parameter value of a first non-volatile memory of a non-volatile dual in-line memory module (NVDIMM) and generating, in response to the endurance parameter value exceeding a warning threshold, a system alert. The method may also include initiating, in response to the endurance parameter value exceeding a replacement threshold greater than the warning threshold, an upgrade process. The upgrade process may include copying data from the first non-volatile memory to a volatile memory of the NVDIMM and copying, in response to the first non-volatile memory being replaced with a second non-volatile memory, the data from the volatile memory to the second non-volatile memory.

Embodiments may also be directed towards an NVDIMM. The NVDIMM may include a first non-volatile memory card having at least one non-volatile memory chip and a second non-volatile memory card having at least one non-volatile memory chip. The NVDIMM may also include a volatile memory card having at least one volatile memory chip and an NVDIMM controller. The volatile memory card may be configured to electrically couple the NVDIMM controller, through a first connector, to a host system. The volatile memory card may also have a second connector configured to electrically couple the NVDIMM controller, individually, to the first non-volatile memory card and to the second non-volatile memory card. The NVDIMM controller may be configured to perform a method. The method may include monitoring an endurance parameter value of the first non-volatile memory card and issuing, in response to the endurance parameter value exceeding a warning threshold, a system alert to the host system. The method may also include copying, in response to the endurance parameter value exceeding a replacement threshold greater than the warning threshold, data stored in the first non-volatile memory card to the volatile memory card. The method may also include enabling a visual indicator that indicates the first non-volatile memory card to be replaced with the second non-volatile memory card. The method may also include copying, following replacement of the first non-volatile memory card with the second non-volatile memory card, data stored in the volatile memory card to the second non-volatile memory card.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
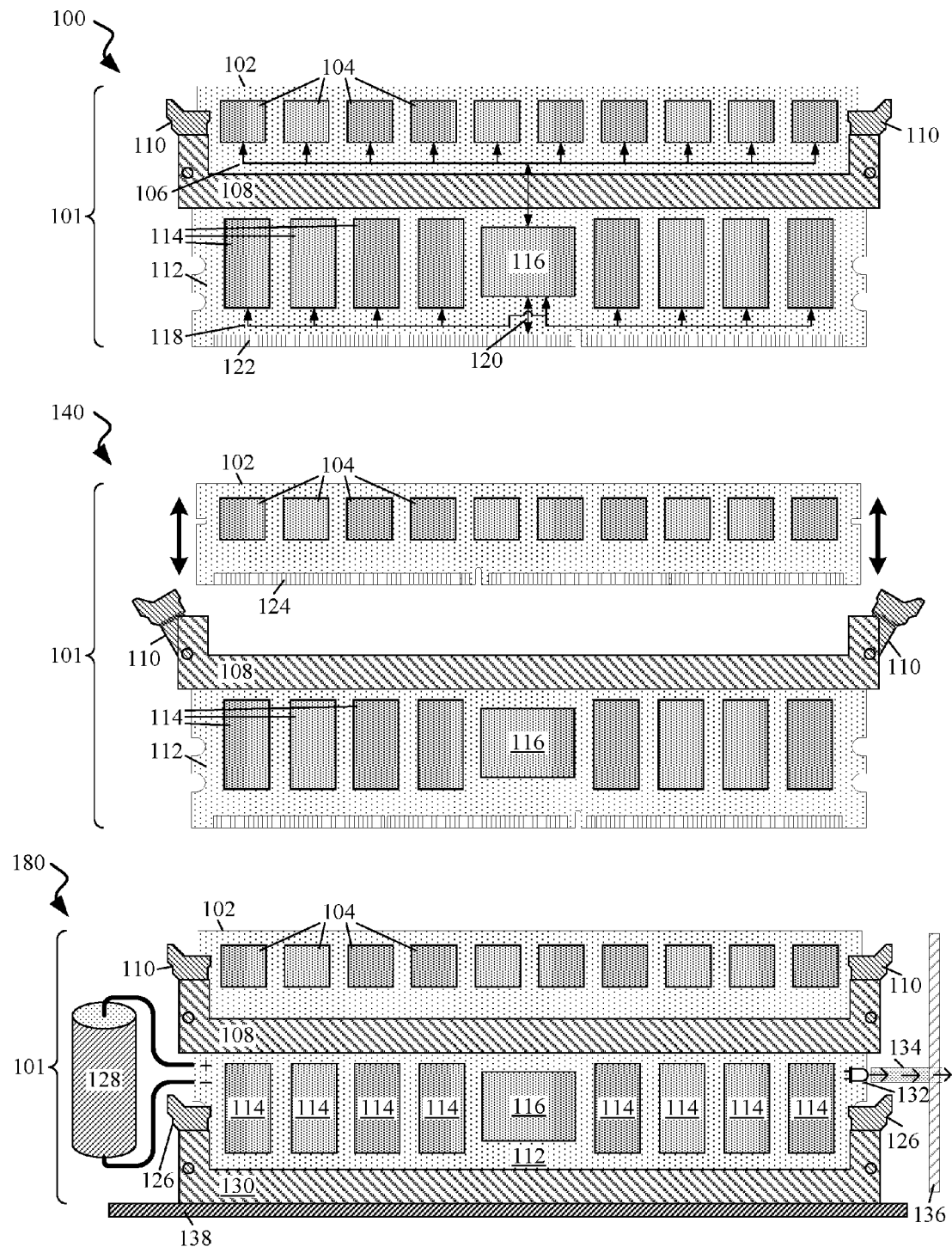
FIG. 1 includes three consistent views depicting a non-volatile dual in-line memory module (NVDIMM) having an NVDIMM controller and a replaceable non-volatile memory card, according to embodiments consistent with the figures.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing high-bandwidth, non-volatile data storage for use with integrated circuits (ICs) such as processor chips, which may be used to provide computational capability for electronic systems such as computers and servers. Such computers and servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing high-bandwidth, non-volatile data storage for use with ICs such as special-purpose processors, which may be used in a wide variety of computational and data processing applications. Such computing systems may include, but are not limited to, supercomputers, high-performance computing (HPC) systems, and other types of special-purpose computers. Embodiments may also be directed towards providing high-bandwidth, non-volatile data storage for use with processor ICs arranged in stacked, high-density configurations, for example, in three-dimensional integrated circuit (3-D IC) structures.

For ease of discussion, the term "non-volatile memory" is used interchangeably herein with the term "flash memory", in reference to a class of semiconductor memory chips and/or memory cards populated with chips, which can provide long-term, persistent data storage for electronic systems such as computers. Such memory chips are designed to retain data following the removal or interruption of power supplied to the chip. For ease of discussion, the term "volatile memory" is used interchangeably herein with the term "dynamic random-access memory (DRAM)", with reference to a class of semiconductor memory chips and/or memory cards populated with chips, which can provide temporary, volatile electronic data storage. Such memory chips do not retain data following the removal or interruption of power supplied to the chip.

A non-volatile dual in-line memory module (NVDIMM) incorporates, in a hybrid device, both volatile memory, e.g., DRAM, and non-volatile memory, e.g., flash memory. An NVDIMM also includes a memory controller and an independent electrical power source known as a "supercapacitor" or "ultracapacitor".

An NVDIMM can have a form factor and electrical interface compatible with an industry standard dual in-line memory module (DIMM) such as a double data rate type three (DDR3) or a double data rate type four (DDR4) DIMM, that allow it to be used in computing systems designed for these types of devices. The form factor can include the module outline, dimensions and edge card connector pinout, while the electrical interface can include a signaling protocol that is compatible with industry standard memory modules.

During normal operation, an NVDIMM is plugged into, and draws power from, an industry standard DIMM socket and operates in a manner consistent with a standard DRAM DIMM, within a host electronic system. In the event of a power interruption such as an unexpected power loss or system crash, temporary power is provided by an independent power source such as a "supercapacitor". The supercapacitor contains sufficient energy capacity to power the NVDIMM controller to transfer the data stored in the volatile memory, e.g., DRAM, to the non-volatile memory, e.g., flash. When power is restored to the DIMM socket, the saved memory state of the DRAM is restored to the DRAM from the NVDIMM's flash memory by the NVDIMM controller. An NVDIMM can thus be useful for preserving and retaining critical data stored in it through a system crash or power loss event.

An NVDIMM used in an electronic system such as a computer can provide significant advantages over individual DRAM DIMMs and flash memory by combining strengths of both of these memory technologies. An NVDIMM can merge the high-bandwidth, low-latency performance of DRAM DIMMs with the high reliability and persistent storage of flash memory. An NVDIMM does not require host system interaction beyond normal read/write requests, and the non-volatile memory of an NVDIMM can store data for an extended period without requiring a power supply voltage. In addition, the relative per-bit cost of non-volatile memory is generally lower than the per-bit cost of volatile memory, which can make NVDIMMs a cost-effective alternative to other types of memory devices.

An NVDIMM can be useful for storing and ensuring the integrity of certain forms of critical data. For example, in applications such as high speed online transaction processing (OLTP), unexpected data loss could result in the failure of financial transactions, leaving data unrecoverable or corrupted. If such data is stored in an NVDIMM, it can be protected against corruption and loss due to unexpected and unpredictable events such as a system crash or unexpected power loss.

Various non-volatile memory technologies such as flash memory, are subject to a physical "wear-out" mechanism which renders the memory progressively less reliable as the number of cycles of reading and writing data, also known as "program-erase" (PE) cycles, increases. A number of PE cycles can serve as a criterion for quantifying the endurance of a flash memory device. Although manufacturers of non-volatile memory have taken various operations to extend the usable lifespan or "endurance limit" of non-volatile memory devices, eventually such devices generally become unreliable and are replaced in order to maintain the integrity of data stored in them. In contrast, volatile memory devices such as DRAM and static random-access memory (SRAM) chips lack such a wear-out mechanism, and therefore can have greatly extended lifespans and seldom need to be replaced. As an NVDIMM includes non-volatile memory devices, the non-volatile portion of the NVDIMM can become unreliable after a specified number of PE cycles, and may need to be replaced in order to ensure the integrity of data stored in it.

An entire NVDIMM installed in a host system can be replaced at a regular service interval in order to ensure its reliability and the integrity of data stored in it. However, this strategy may not be particularly cost-effective, as the volatile memory portion, printed circuit card and NVDIMM controller may still be serviceable and reliable. In addition, various NVDIMMs installed within a host system may accumulate PE cycles at different rates, due to their unique usage patterns. Replacing NVDIMMs at a regular service interval that is calculated and implemented for the most active NVDIMM in a host system may result in other NVDIMMs being replaced unnecessarily early, thus increasing service costs and possible system downtime during the replacement operation.

Replacing an entire NVDIMM while its host electronic system or computer is running may require either disabling or shutting down the host system, or requiring the host system to move data stored in the NVDIMM to an alternate location for the duration of the replacement operation. Such operations may make the data stored in the NVDIMM inaccessible while the NVDIMM is being replaced.

An NVDIMM according to embodiments of the present disclosure includes a "base" card of the NVDIMM populated with volatile memory chips, an NVDIMM controller and a connector configured to receive and electrically connect to a replaceable card populated with non-volatile memory chips. The NVDIMM controller is configured to monitor the number of PE cycles, or other endurance parameter, of the non-volatile memory chips and compare the endurance parameter value to known endurance threshold values. In response to at least one of the threshold values being exceeded, the NVDIMM controller can alert a user or service technician to initiate an upgrade process, during which the first, installed non-volatile memory card is replaced.

According to embodiments, this upgrade and replacement process allows the data stored in the installed non-volatile memory card to be temporarily transferred, by the NVDIMM controller, to the volatile memory card of the NVDIMM. During the upgrade process the data is preserved and can still remain accessible to the host system, resulting in no system downtime or interruption to normal memory operations. The installed non-volatile memory card of the NVDIMM is only replaced when the number of PE cycles exceeds a predetermined endurance threshold value, resulting in cost-efficient use of memory cards and a reduced number of service operations, while preserving the integrity of critical data stored in an NVDIMM.

Aspects of the various embodiments may be useful for providing cost-effective high-performance, non-volatile data storage for use with electronic systems, by using existing and proven system design and simulation practices, and memory device and printed circuit board (PCB) technologies. An NVDIMM designed according to certain embodiments may be useful in reducing replacement costs and service actions related to the replacement of non-volatile memory cards within an electronic system.

An upgrade process according to embodiments of the present disclosure may provide for replacement of non-volatile memory cards that does not incur downtime of a host electronic system in which the modules are installed. Such an upgrade process may be performed without the need for additional host system data storage and/or other host system resources, which may enhance host system availability and data integrity.

An upgrade process according to embodiments can effectively compensate for the wear-out mechanism of a non-volatile memory card, and protect stored data by monitoring usage of the installed non-volatile memory card and initiating its replacement prior to the device becoming unreliable. Embodiments of the present disclosure can incorporate a variety of flash and DRAM memory technologies.

The figures herein depict example memory cards and/or modules populated with a particular number of non-volatile and volatile memory chips. In embodiments, the number of memory chips may vary, depending on factors such as memory architecture, organization and size, and whether the memory chips support parity and error-correcting code (ECC) schemes.

Certain embodiments relate to an NVDIMM configured to, during an upgrade process, back up data stored in an installed non-volatile memory card of the NVDIMM to a volatile memory card of the NVDIMM. FIG. 1 includes three consistent views 100, 140 and 180, depicting an NVDIMM 101 that includes a replaceable non-volatile memory card 102 and a volatile memory card 112, according to embodiments of the present disclosure. NVDIMMs may be useful for providing an electrical system such as a computer with high-bandwidth, low latency, persistent, non-volatile data storage capability.

Volatile memory card 112 includes volatile memory chips 114, an NVDIMM memory controller 116, memory card contact pads 122 and non-volatile memory card connector 108. Types of volatile memory chips 114 can include, but are not limited to, DRAM chips, random-access memory (RAM) chips and SRAM chips. Particular types and/or technologies of volatile memory chips may be chosen to meet the needs of a particular application. According to embodiments, volatile memory chips 114 can be useful in providing high-bandwidth, low latency, random-access electronic data storage for a host electronic system such as a computer.

Non-volatile memory card connector 108 is mechanically configured to receive and retain a replaceable non-volatile memory card 102, as depicted in view 100. Memory card connector 108 is also configured to electrically connect the NVDIMM controller 116 to the non-volatile memory card 102. Connector 108 can be selected or designed to provide robust electrical characteristics suitable for the transmission of electronic signals and delivery of electrical power to non-volatile memory card 102.

Non-volatile memory card connector 108 includes latches 110, which can be used to secure non-volatile memory card 102 within memory card connector 108, when in a latched position, and to release non-volatile memory card 102 from memory card connector 108, when in a released position, as shown in view 140.

Non-volatile memory card 102 includes non-volatile memory chips 104, which can be used to provide reliable, non-volatile data storage for a host electronic system such as a computer. According to embodiments, types of non-volatile memory chips 104 can include, but are not limited to, flash memory chips, erasable programmable read-only memory (EPROM) chips, ferroelectric random-access memory (FRAM) chips, magnetoresistive random-access memory (MRAM) chips, and other types of non-volatile semiconductor memory devices. Particular types and/or technologies of non-volatile memory chips may be chosen to meet the needs of a particular application.

The NVDIMM controller 116 on the volatile memory card 112 can be configured to monitor PE cycles, or other endurance-related parameters of non-volatile memory chips 104. The NVDIMM controller 116 can also be configured to transfer data across the non-volatile memory bus 106, to and from the non-volatile memory chips 104, and to transfer data across the volatile memory bus 118, to and from the volatile memory chips 114. The NVDIMM controller 116 may transfer data in response to commands received across the bus 120 from a host system. In embodiments, the NVDIMM controller 116 can be electrically connected to the host system through the bus 120, in conjunction with the memory card contact pads 122, and the memory card connector 130, view 180.

NVDIMM 101 can be designed to function when inserted into an industry standard memory module socket such as a DDR3 or DDR4 socket. The non-volatile memory bus 106, volatile memory bus 118 and bus 120 may include address, command/control and data signal groups, consistent with signal groups found in industry standard memory buses such as DDR3 and DDR4 buses. Memory card contact pads 122 can have an industry standard footprint and/or pattern, on one or both sides of volatile memory card 112.

View 140 is consistent with view 100 and depicts NVDIMM 101 with a removable non-volatile memory card 102 disassembled from volatile memory card 112. According to embodiments, an installed non-volatile memory card 102 can be replaced with a replacement non-volatile memory card, as the installed non-volatile memory card 102 approaches or exceeds an endurance limit, after which the non-volatile memory card 102 may become unreliable for data storage.

Non-volatile memory card 102 can be designed with a set of non-volatile memory card contact pads 124, which provide electrical contacts for interfacing the card 102 with volatile memory card 112, through non-volatile memory card connector 108.

Non-volatile memory card 102 may also be designed to have unique mechanical keying features to prevent insertion of other types of memory cards into non-volatile memory card connector 108. View 140 depicts latches 110 in released positions, which can allow non-volatile memory card 102 to be removed and replaced.

View 180, consistent with views 100 and 140, depicts a non-volatile memory card 102 assembled to volatile memory card 112, and the volatile memory card 112 assembled, through insertion into memory card connector 130, to a motherboard 138 of a host system. In embodiments, memory card connector 130 can be an industry standard memory card connector such as a DDR3 connector or a DDR4 connector.

Memory card connector 130 includes latches 126, which can be used to secure volatile memory card 112 within memory card connector 130, when in a latched position, and to release volatile memory card 112 from memory card connector 130, when in a released position. The operation of latches 126 is consistent with the operation of latches 110, as depicted in views 100 and 140.

FIG. 1 depicts a single NVDIMM 101 assembled to a motherboard 138, however in some embodiments, a plurality of NVDIMMs 101 assembled to motherboard 138 may be possible. For example, in some embodiments, a motherboard 138 or PCB in an electronic system may be populated with four NVDIMM modules.

Supercapacitor 128 may be a single capacitor or multiple capacitors, connected in parallel, located within the host system. Supercapacitor 128 is an independent power source that can provide the NVDIMM 101 with power during a system power failure, system shutdown or other power interruption event. The consistent power provided by supercapacitor 128 can be useful for powering the NVDIMM controller 116 for a duration sufficient to transfer data stored in the volatile memory chips 114 to the non-volatile memory chips 104. Such a data transfer can protect critical data stored in the volatile memory chips 114 from corruption or loss.

A supercapacitor, also referred to as an "ultracapacitor", is a high-capacity electrochemical capacitor that can store between 10 and 100 times more energy per unit volume than an electrolytic capacitor, can receive and deliver charge much faster than conventional batteries, and can tolerate more charge and discharge cycles than rechargeable batteries.

Volatile memory card 112 includes a light-emitting diode (LED) 132, electrically coupled to the NVDIMM controller 116. The NVDIMM controller 116, in response to an endurance parameter value of non-volatile memory chips 104 exceeding a warning and/or replacement threshold value, can issue an alert to the host system and/or illuminate the LED 132. In some embodiments, the LED 132 can emit multiple colors of light, for example, red, yellow and green. Operation of such multicolor LEDs can be useful to indicate the number of PE cycles the NVDIMM 101 has experienced. For example the LED 132 can emit green light to indicate that the number of PE cycles of the NVDIMM 101 are below a warning endurance threshold value, and that the NVDIMM 101 is fully operational with minimal risk of data loss. Similarly, the LED 132 can emit yellow light to indicate that the number of PE cycles of the NVDIMM 101 is between the warning and a replacement endurance threshold value, and that the NVDIMM 101 is needing replacement soon in order to avoid data loss. The LED 132 can emit red light to indicate that the number of PE cycles are above the replacement endurance threshold value, and that the NVDIMM 101 requires immediate replacement in order to avoid data loss.

According to embodiments the LED 132 may be optically coupled to a light pipe 134, which can be used to transmit light from the volatile memory card 112, through an equipment panel 136, to an exterior surface of the host system, where it can be viewed by an individual responsible for replacing the non-volatile memory card 102. According to embodiments, the light pipe 134 may be constructed from any optically transparent/transmissive materials including, but not limited to, Lexan™, fused silica, clear polycarbonates, optically transparent polymers and optical grade acrylics.

Figure 2:
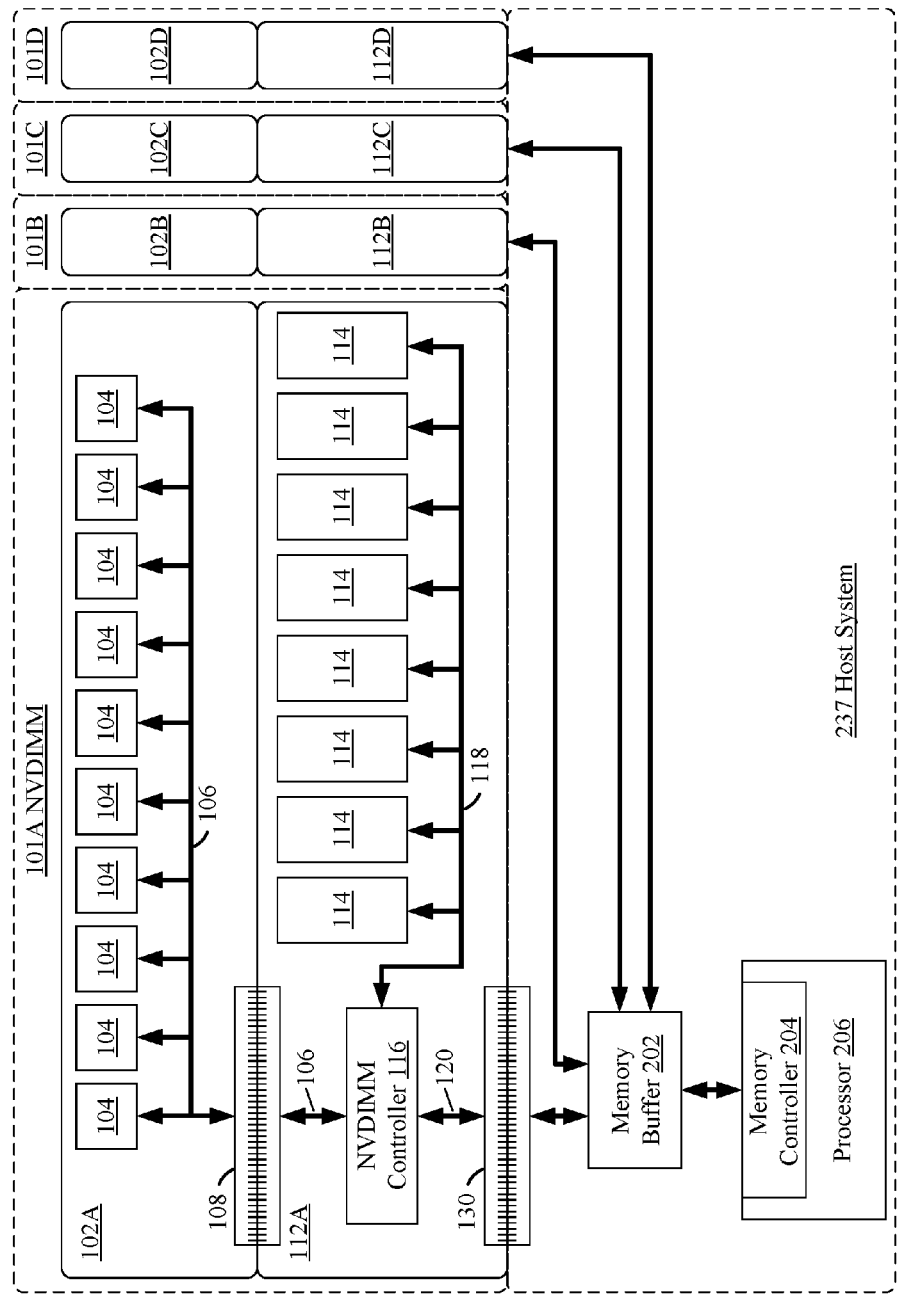
FIG. 2 is a block diagram depicting a computing system including an NVDIMM with a replaceable non-volatile memory card, according to embodiments consistent with the figures.

FIG. 2 includes a block diagram 200 depicting a computing system including NVDIMMs 101A, 101B, 101C and 101D with replaceable non-volatile memory cards 102A, 102B, 102C and 102D, respectively, according to embodiments consistent with the figures.

NVDIMM 101A includes non-volatile memory card 102A with non-volatile memory chips 104 connected to non-volatile memory bus 106. Non-volatile memory bus 106 is electrically connected to volatile memory card 112A through non-volatile memory card connector 108. Volatile memory card 112A includes volatile memory chips 114, NVDIMM controller 116 and volatile memory bus 118, consistent with FIG. 1.

FIG. 2 also depicts NVDIMMs 101B, 101C and 101D, including non-volatile memory cards 102B, 102C and 102D, coupled to volatile memory cards 112B, 112C and 112D, respectively. According to embodiments, NVDIMMs 101B, 101C and 101D are consistent with NVDIMM 101A. In some embodiments, a host system such as 237 may include a single NVDIMM, e.g., 101A, four NVDIMMs, as depicted in FIG. 2, or another number of NVDIMMs suitable to meet the data storage, accessibility and bandwidth needs of the particular host system. According to embodiments, NVDIMMs 101A, 101B, 101C and 101D can be installed in industry standard sockets, e.g., memory card connector 130, that are attached to a motherboard or other PCB.

In some embodiments, a memory buffer 202 may be interconnected between the NVDIMMs, e.g., 101A, 101B, 101C and 101D, and a memory controller 204, and may be useful for buffering data, command and control signals sent to the NVDIMMs. In some embodiments, the logic and/or circuit functions included in memory buffer 202 may be included within memory controller 204 and/or processor 206. According to embodiments, the function of memory controller 204 can be consistent with memory controllers used to access industry standard memory modules such as DDR3 and DDR4 modules. In embodiments, processor 206 can be a single processor chip or a cluster of interconnected processor chips, consistent with processors found in personal computers, servers, high-performance computers (HPCs) or other computing device(s) and/or system(s). In some embodiments, the functions of processor 206 and memory controller 204 may be integrated into a single chip and/or electronic module, and in some embodiments, the functions of processor 206 and memory controller 204 may be distributed among multiple chips and/or electronic modules.

The processor 206, in conjunction with memory controller 204, may initiate memory transactions involving data read and write operations to and from NVDIMMs 101A, 101B, 101C and 101D. The NVDIMMs may be useful in providing high-bandwidth, low latency, secure data storage for data accessed and processed by processor 206 of host system 237.

In some embodiments, the memory capacity of the non-volatile memory chips 104 of non-volatile memory card 102A can be greater than the memory capacity of the volatile memory chips 114 of volatile memory card 112A. In such embodiments, the volatile memory card 112A can act as a write buffer for the non-volatile memory card 102A, where data written to the volatile memory card 112A is copied, at a later time, to the non-volatile memory card 102A. In some embodiments, the volatile memory card 112A and the non-volatile memory card 102A can have the same memory capacity. In general, the volatile memory chips 114 can receive data written to them at a higher rate then can the non-volatile memory chips. This higher data write speed may be useful in buffering data write activity to the NVDIMM 101A and can result in a higher bandwidth memory module than is achievable by using only non-volatile memory chips 104.

According to embodiments, NVDIMMs, e.g., 101A, can be operated in either an "access through mode" or a "halted mode" during an upgrade/replacement of non-volatile memory card 102A. When NVDIMMs are operated in an access through mode during the upgrade operation, host system 237 is allowed to access data stored in the NVDIMMs, 101A, 101B, 101C and 101D. Such access involves, during a read operation, the NVDIMM controller 116 retrieving the data stored in the NVDIMMs from copy(s) located on the volatile memory card(s) 102A, 102B, 102C and 102D. In addition to retrieving the data, NVDIMM controller 116 may also decompress the data before sending it over bus 120 to memory controller 204. Similarly, during a write operation, in access through mode, the NVDIMM controller 116 may also compress the data received from memory controller 204, before writing it to the volatile memory card(s), e.g., 112A. Although data stored in the NVDIMMs would still be accessible during access through mode, the operations of data compression and decompression would add additional latency to any read or write operations.

When NVDIMMs are operated in halted mode during the upgrade operation, host system 237 would not be allowed to access data stored in the NVDIMMs, 101A, 101B, 101C and 101D. Access to data on the NVDIMMs would resume following the completion of the replacement of installed non-volatile memory card 102.

Figure 3:
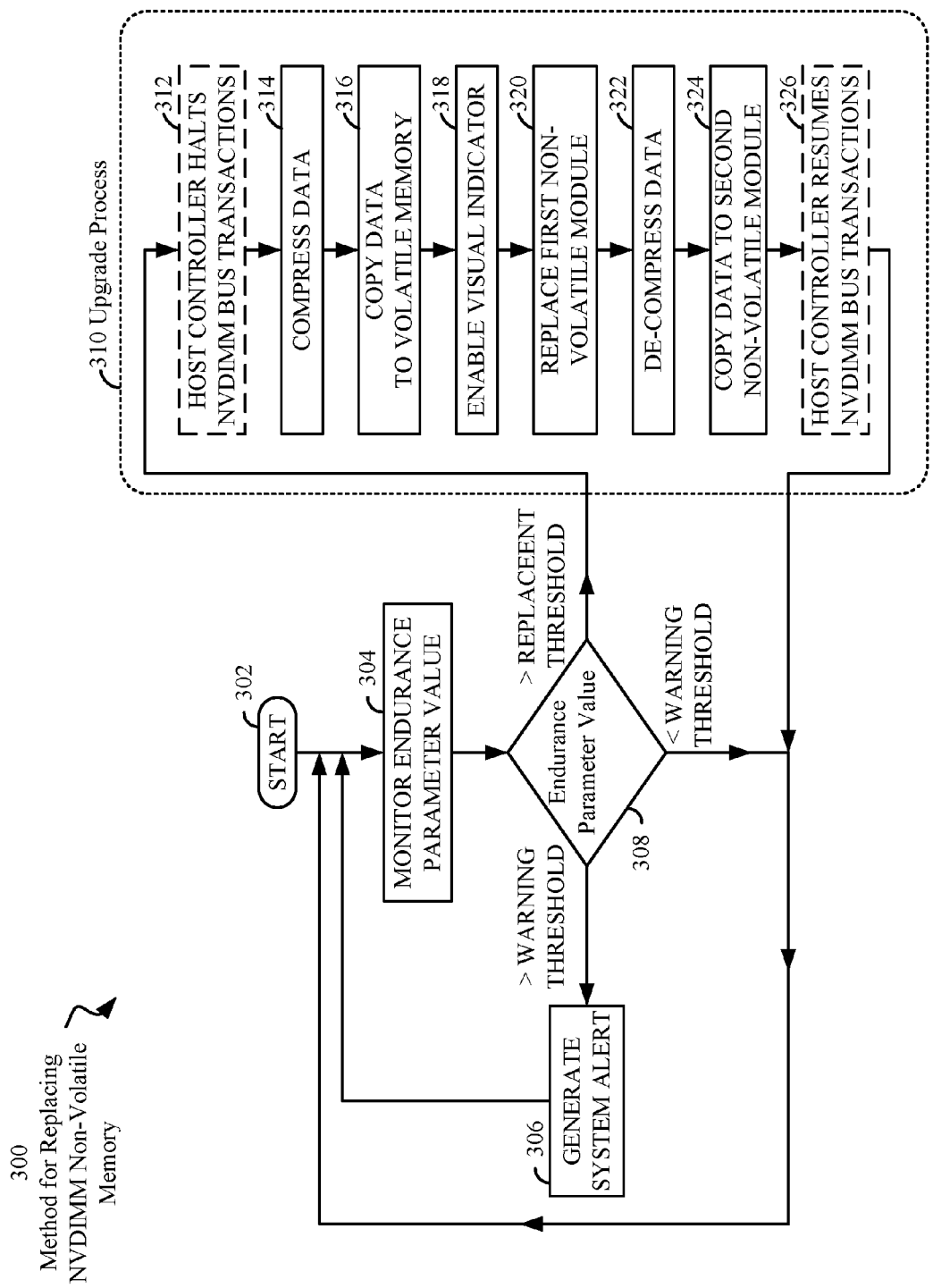
FIG. 3 is a flow diagram illustrating a method for backing up and replacing a non-volatile memory card of an NVDIMM, according to embodiments.

FIG. 3 is a flow diagram 300 illustrating a method for backing up and replacing an installed non-volatile memory card of a non-volatile dual in-line memory module (NVDIMM), according to embodiments. The process 300 moves from start 302 to operation 304.

Operation 304 generally refers to monitoring an endurance parameter value of a first, installed and operational, non-volatile memory card of an NVDIMM. According to embodiments, an endurance parameter value may be monitored by an NVDIMM memory controller.

The endurance parameter value can be useful as a metric of the general reliability of a non-volatile memory card and/or chips of an NVDIMM. According to embodiments, an endurance parameter value may take on several forms. For example, in some embodiments, the endurance parameter value can be a count of PE cycles experienced by an installed non-volatile memory card. The number of PE cycles that a non-volatile memory chip or card can experience before it becomes unreliable can be modeled, measured and correlated to empirical non-volatile memory failure results. Such modeling, measurement and correlation activity may be useful to determine "safe" endurance threshold values that can be used to predict when a non-volatile memory chip or module will begin to perform unreliably.

In some embodiments, the endurance parameter value may indicate a non-volatile memory die or package failure, such as a cyclic redundancy check (CRC) error produced by a memory controller or processor circuit. A CRC error can result from a non-volatile memory chip or module producing data, through a read operation, that differs from data previously written into it. Other types of memory failure indicators, such as those generated by bit error rate (BER) detection, may also be useful as endurance parameters. Once the endurance parameter value has been monitored, the process 300 moves to operation 308.

At operation 308, the endurance parameter value is compared against known endurance threshold values, and a decision is made based upon the endurance parameter value. According to embodiments, a warning endurance threshold value may be used to indicate that an installed non-volatile memory card has experienced sufficient usage, e.g., PE cycles, to warrant its upcoming replacement. The calculation of the warning endurance threshold value may take into account an estimated time for a service technician to respond to a notification that the warning endurance threshold has been reached, and to replace the installed non-volatile memory card.

A replacement endurance threshold, higher than the warning endurance threshold, may be used to indicate that an installed non-volatile memory card has experienced sufficient usage, e.g., PE cycles, to warrant its immediate replacement. By way of example, a "critical" number of PE cycles of an NVDIMM may be determined, through calculation or modeling, to correlate to a particular unacceptable failure rate for the NVDIMM. The warning endurance threshold value may be set, for example, to a value that is 80% of the critical number of PE cycles, and the replacement endurance threshold value may be set, for example, at 95% of the critical number.

According to embodiments, the comparing and decision-making operations described above may be performed by the NVDIMM memory controller. The warning and replacement endurance thresholds can be programmed into the NVDIMM memory controller, and in some embodiments additional endurance thresholds or monitored NVDIMM conditions may be used in the decision process described above. In some embodiments, the warning and replacement endurance threshold values can be modified by the host system, e.g., 237, FIG. 2.

If the endurance parameter value is less than or equal to the warning endurance threshold value, the process 300 returns to operation 304, where endurance parameter monitoring continues. If the endurance parameter value is greater than the warning endurance threshold value but less than or equal to the replacement endurance threshold value, the process moves to operation 306. If the endurance parameter value is greater than the replacement endurance threshold, the process moves to upgrade process 310, starting with operation 312. The upgrade process 310 includes operations 312 through 326.

Operation 306 generally refers to generating a system alert. According to embodiments, a system alert includes generating a notification to a host system indicating the endurance parameter of the installed non-volatile memory card has exceeded the warning endurance threshold. The system alert may include a text message sent to a system administrator or service technician, an entry into a service log, or other type of message, sent to a host system, and intended to initiate the replacement of an installed non-volatile memory card of a particular NVDIMM. In some embodiments, the system alert can include illuminating an LED to a particular color, e.g., yellow, to indicate the need for replacement of the installed non-volatile memory card of the particular NVDIMM. Once the system alert has been generated, the process moves to operation 304, where endurance parameter monitoring continues.

Operation 312 generally refers to halting of read/write transactions or activity between the NVDIMM and a host system. In some embodiments, a memory controller, e.g., 204, FIG. 2, of a host system, may halt any future read or write transactions to the particular NVDIMM having a non-volatile memory card in need of replacement. Halting of future memory transactions can correspond to the NVDIMM being placed in a "halted mode", and is an optional operation in the upgrade process 310. Halting of read/write transactions involving the NVDIMM may be performed in scenarios where continuity of access to data stored in the NVDIMM is not critical, and where rapid replacement of the installed non-volatile memory card is expected. Read/write transactions may not be halted if the NVDIMM is placed in an "access through" mode. Once the read/write transactions or activity between the NVDIMM and a host system has been halted, the process moves to operation 314.

Operation 314 generally refers to compressing data stored in the installed non-volatile memory card. According to embodiments, an NVDIMM controller may apply a data compression algorithm to data stored in the installed non-volatile memory card. Data compression may be useful to reduce the amount of memory capacity needed to store the data, in the case where the storage area consumed by the uncompressed data in the installed non-volatile memory card is greater than the amount of memory available in the volatile memory card of the NVDIMM. In cases where sufficient memory capacity exists within the volatile card of the NVDIMM to hold the data contained in the installed non-volatile memory card, data compression may not be necessary. Once the data stored in the installed non-volatile memory is compressed, the process moves to operation 316.

Operation 316 generally refers to copying the data stored in the installed non-volatile memory card to the volatile memory card. The NVDIMM memory controller copies the data stored in the installed non-volatile memory card to the volatile memory card, following the compression performed in operation 314. Creating a copy of the data in the volatile memory card is useful for preserving it, and possibly allowing access to it, while the installed non-volatile memory card of the NVDIMM is being replaced. Once the data stored in the installed non-volatile memory card is copied to the volatile memory card, the process moves to operation 318.

Operation 318 generally refers to enabling a visual indicator on the NVDIMM. According to embodiments, the visual indicator can be an LED or other light-producing device which can be used to indicate, to a service technician, a particular NVDIMM having a non-volatile memory card in need of replacement. The NVDIMM controller can be configured to illuminate the LED, in response to the endurance parameter value exceeding the warning and/or replacement endurance threshold(s). In some embodiments the NVDIMM controller can flash or blink the LED, which can, in some embodiments, emit various colors of light corresponding to the endurance parameter value exceeding the warning endurance threshold and/or the replacement endurance threshold. Once the visual indicator is enabled, the process moves to operation 320.

Operation 320 generally refers to replacing the installed non-volatile memory card with a replacement non-volatile memory card. According to embodiments, the installed non-volatile memory card is replaced in response to a visual indicator being enabled, and/or a system alert being received by a service technician. Replacing the installed non-volatile memory card is useful in providing the NVDIMM and the host system with reliable non-volatile memory devices.

In response to the replacement of the installed non-volatile memory card with the replacement non-volatile memory card, the NVDIMM controller can detect, and communicate to the host system, the presence of the replacement non-volatile memory card. Detection of the replacement non-volatile memory card may be accomplished by the NVDIMM controller comparing a unique ID (UID) of the replacement non-volatile memory card against a UID of the original, installed non-volatile memory card. In some embodiments, the replacement non-volatile memory card may be detected by the host system, in response to a user service technician notifying the host system of the completed non-volatile memory card replacement. Once the installed non-volatile memory card is replaced, the process moves to operation 322.

Operation 322 generally refers to decompressing the data stored in the volatile memory. According to embodiments, the NVDIMM controller can apply a decompression algorithm compatible with the compression algorithm applied in operation 314, to the data stored in the volatile memory card of the NVDIMM. Decompressing the data may be useful in providing a copy of the data to the non-volatile memory card that is easily accessed and used by the host system. Once the data stored in the volatile memory card is decompressed, the process moves to operation 324.

Operation 324 generally refers to copying the data stored in the volatile memory card to the replacement non-volatile memory card. According to embodiments, the NVDIMM controller copies the data stored in the volatile memory card of the NVDIMM to the replacement non-volatile memory card. The copying is performed in response to detection, either by the NVDIMM controller, or by the host system, that the originally installed non-volatile memory card has been replaced. This copying is useful in providing a persistent, secure copy of the data for use by the host system. Once the data stored in the volatile memory card is copied to the replacement non-volatile memory card, the process moves to operation 326.

Operation 326 generally refers to resuming read/write transactions or activity between the NVDIMM and the host system. The operation of resuming read/write transactions between the NVDIMM and host system is performed in response to the halting of such transactions performed in operation 312. According to embodiments, the host system initiates the resuming of transactions in response to the completion of operation 324, described above. Resuming read/write transactions allows the NVDIMM to be freely accessed by the host system, and resume its normal function of providing data storage to the host system. Once read/write transactions between the NVDIMM and the host system have resumed, the process returns to operation 304, where endurance parameter monitoring continues.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), a static random-access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of at least one programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises at least one executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:

a memory; and a processor in communication with the memory, the processor configured to obtain instructions from the memory that cause the processor to perform a method comprising:

monitoring an endurance parameter value of a first non-volatile memory of a non-volatile dual in-line memory module (NVDIMM) located within a host system, the endurance parameter value being a count of program-erase (P/E) cycles applied to the first non-volatile memory;

illuminating, to a green color, in response to the endurance parameter value not exceeding a warning threshold, a light-emitting diode (LED) mounted on a volatile memory card of the NVDIMM, the LED coupled to a light pipe configured to transmit light from the LED through an equipment panel to an exterior surface of the host system, whereby the light from the LED is viewable by an individual responsible for replacing the first non-volatile memory, the green color indicating the endurance parameter value of the first non-volatile memory has not exceeded the warning threshold;

illuminating, in response to the endurance parameter value exceeding a warning threshold, the LED to a yellow color, the yellow color indicating the endurance parameter value of the first non-volatile memory has exceeded the warning threshold; and initiating, in response to the endurance parameter value exceeding a replacement threshold greater than the warning threshold, an upgrade process, the upgrade process including copying data from the first non-volatile memory to the volatile memory card of the NVDIMM, the upgrade process further including copying, in response to the first non-volatile memory being replaced with a second non-volatile memory, the data from the volatile memory to the second non-volatile memory, the upgrade process further including illuminating the LED a red color, the red color indicating the endurance parameter value of the first non-volatile memory has exceeded the replacement threshold.

* * * * *